United States Patent
Moos et al.

(10) Patent No.: US 10,597,795 B2
(45) Date of Patent: Mar. 24, 2020

(54) METHOD FOR PRODUCING A SEMICONDUCTOR WAFER WITH EPITAXIAL LAYER IN A DEPOSITION CHAMBER, APPARATUS FOR PRODUCING A SEMICONDUCTOR WAFER WITH EPITAXIAL LAYER, AND SEMICONDUCTOR WAFER WITH EPITAXIAL LAYER

(71) Applicant: SILTRONIC AG, Munich (DE)

(72) Inventors: Patrick Moos, Pleiskirchen (DE); Reinhard Schauer, Laufen (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 15/778,549

(22) PCT Filed: Nov. 24, 2016

(86) PCT No.: PCT/EP2016/078618
§ 371 (c)(1),
(2) Date: May 23, 2018

(87) PCT Pub. No.: WO2017/093102
PCT Pub. Date: Jun. 8, 2017

(65) Prior Publication Data
US 2018/0282900 A1    Oct. 4, 2018

(30) Foreign Application Priority Data
Dec. 1, 2015   (DE) .................. 10 2015 223 807

(51) Int. Cl.
| | |
|---|---|
| *H01L 21/673* | (2006.01) |
| *C30B 25/12* | (2006.01) |
| *H01L 21/67* | (2006.01) |
| *C30B 29/06* | (2006.01) |
| *H01L 21/687* | (2006.01) |
| *H01L 21/02* | (2006.01) |
| *H01L 21/677* | (2006.01) |

(52) U.S. Cl.
CPC .............. *C30B 25/12* (2013.01); *C30B 29/06* (2013.01); *H01L 21/02532* (2013.01);
(Continued)

(58) Field of Classification Search
CPC ......... H01L 21/02518; H01L 21/02532; H01L 21/02634; H01L 21/67167;
(Continued)

(56) References Cited

U.S. PATENT DOCUMENTS

| | | |
|---|---|---|
| 6,316,361 B1 | 11/2001 | Hansson |
| 2008/0118712 A1 | 5/2008 | Schauer et al. |

(Continued)

FOREIGN PATENT DOCUMENTS

| | | |
|---|---|---|
| EP | 0 800 203 A2 | 10/1997 |
| EP | 1 289 006 A1 | 3/2003 |

(Continued)

*Primary Examiner* — Stephen W Smoot
(74) *Attorney, Agent, or Firm* — Brooks Kushman P.C.

(57) ABSTRACT

Semiconductor wafers with an epitaxial layer are produced in a deposition chamber by placing a substrate wafer in the edge region of the rear side of the substrate wafer onto a placement area of a susceptor;
loading the deposition chamber with the susceptor and the substrate wafer lying on the susceptor by contacting the susceptor and transporting the susceptor and the substrate wafer lying on the susceptor from a load lock chamber into the deposition chamber;
depositing an epitaxial layer on the substrate wafer; and
unloading the deposition chamber by contacting the susceptor and transporting the susceptor and a semiconductor wafer with epitaxial layer, the semiconductor wafer having been produced in the course of depositing the epitaxial layer and lying on the susceptor, from the deposition chamber into the load lock chamber.

4 Claims, 8 Drawing Sheets

(52) U.S. Cl.
CPC .. *H01L 21/02634* (2013.01); *H01L 21/67167* (2013.01); *H01L 21/67196* (2013.01); *H01L 21/67201* (2013.01); *H01L 21/67309* (2013.01); *H01L 21/67346* (2013.01); *H01L 21/67383* (2013.01); *H01L 21/67748* (2013.01); *H01L 21/68742* (2013.01)

(58) Field of Classification Search
CPC ......... H01L 21/67196; H01L 21/67201; H01L 21/67346; H01L 21/67383; H01L 21/67748; C30B 25/12
See application file for complete search history.

(56) References Cited

U.S. PATENT DOCUMENTS

| | | |
|---|---|---|
| 2010/0195097 A1 | 8/2010 | Wenz |
| 2010/0273314 A1* | 10/2010 | Ishikawa ............. C23C 16/4583 438/478 |
| 2010/0327415 A1 | 12/2010 | Arai |
| 2011/0049100 A1 | 3/2011 | Han et al. |
| 2012/0177282 A1 | 7/2012 | Chen et al. |
| 2012/0179419 A1 | 7/2012 | Chen et al. |
| 2012/0234243 A1 | 9/2012 | Olgado et al. |
| 2016/0312382 A1* | 10/2016 | Corea ............... H01L 21/68735 |
| 2017/0110352 A1* | 4/2017 | Tobin ............... H01L 21/67201 |

FOREIGN PATENT DOCUMENTS

| | | |
|---|---|---|
| JP | 2004080053 A | 3/2004 |
| KR | 10-2009-0078979 A | 7/2009 |
| KR | 10-2011-0104594 A | 9/2011 |
| WO | 97/14179 A1 | 4/1997 |
| WO | 99/27577 A1 | 6/1999 |
| WO | 2010/015694 A1 | 2/2010 |
| WO | 2015/092525 A1 | 6/2015 |
| WO | 2016/111747 A1 | 7/2016 |

\* cited by examiner

METHOD FOR PRODUCING A SEMICONDUCTOR WAFER WITH EPITAXIAL LAYER IN A DEPOSITION CHAMBER, APPARATUS FOR PRODUCING A SEMICONDUCTOR WAFER WITH EPITAXIAL LAYER, AND SEMICONDUCTOR WAFER WITH EPITAXIAL LAYER

CROSS REFERENCE TO RELATED APPLICATIONS

This application is the U.S. National Phase of PCT Appln. No. PCT/EP2016/078618 filed Nov. 24, 2016, which claims priority to German Application No. 10 2015 223 807.5 filed Dec. 1, 2015, the disclosures of which are incorporated in their entirety by reference herein.

BACKGROUND OF THE INVENTION

1. Field of the Invention

The invention relates to a method for producing a semiconductor wafer with an epitaxial layer in a deposition chamber, an apparatus for producing a semiconductor wafer with epitaxial layer, and a semiconductor wafer with the epitaxial layer.

2. Description of the Related Art

A semiconductor wafer with an epitaxial layer is usually produced by vapor deposition (chemical vapor deposition, CVD). Such a method comprises placing a substrate wafer on a susceptor and conducting a deposition gas through a deposition chamber at high temperature. The epitaxial layer grows on that surface of the substrate wafer which is swept over by the deposition gas. That surface is usually the top face of the substrate wafer situated horizontally. Customary deposition systems comprise, besides the deposition chamber designed for processing individual substrate wafers, at least one load lock chamber from which a substrate wafer is transported into the deposition chamber before the deposition of the epitaxial layer and into which the semiconductor wafer with the epitaxial layer is transported after deposition of the epitaxial layer, in order to allow it to cool therein. The transport process is expediently effected using a computer-controlled transport tool. Such a deposition system is described, for example, in EP 0 800 203 A2.

US 2008/0 118 712 A1 describes a method for producing a semiconductor wafer with an epitaxial layer, wherein a two-part susceptor is used. One part is formed by a ring having a placement area for placing the substrate wafer in the edge region of the rear side of the substrate wafer. The other part is formed by a baseplate, on which the ring lies during the deposition of an epitaxial layer. U.S. Pat. No. 6,316,361 describes an embodiment which provides a ring without baseplate as a susceptor.

Known methods for producing a semiconductor wafer with an epitaxial layer in a deposition chamber are confronted with a series of problems. The latter concern, for example, the rear side of the substrate wafer. The rear side of the substrate wafer is the lower surface of the substrate wafer facing the susceptor. In the course of placing the substrate wafer on the susceptor, the rear side of the substrate wafer in the meantime lies on lift pins, which usually consist of a hard, thermally stable material whose thermal expansion behavior is different from that of the substrate wafer. If the temperature of the lift pins is different from the temperature of the substrate wafer, which is the case for example when loading the deposition chamber with a substrate wafer after a preceding deposition, a relative movement between the lift pins and the substrate wafer can occur. On account of that, the substrate wafer may be shifted from a concentric position with respect to the susceptor and/or the rear side of the substrate wafer may be damaged and/or disturbing particles are produced. Even if such a relative movement fails to occur, after the coating of the substrate wafer it is possible to detect traces indicating structures of the susceptor on the semiconductor wafer with epitaxial layer. Such traces can be detected on the rear side or on the front side of the semiconductor wafer with the epitaxial. The surface of the epitaxial layer is also the surface of the front side of the semiconductor wafer with the epitaxial layer. The structures mentioned include holes in the susceptor which allow access to the substrate wafer for the lift pins, and the lift pins themselves. The traces caused thereby may be detected as pin-mark defects. The fact that holes and lift pins are arranged below the substrate wafer affects the temperature field on the substrate wafer during the deposition of an epitaxial layer. In the temperature field there are locations at lower temperature and/or higher temperature than the average temperature in the temperature field, with the consequence that less and/or respectively more material than intended is deposited at these locations. The gradients in the temperature field are caused by the holes and the lift pins which dissipate heat better or less than the susceptor material surrounding them.

WO 97/14 179 A1 describes a system for processing semiconductor wafers which manages without lift pins. A handling tool operating on the Bernoulli principle is used for transporting the substrate wafer or the semiconductor wafer with epitaxial layer. What is disadvantageous about this system is that the semiconductor wafer with epitaxial layer is damaged by such a handling tool in the region of the edge. Owing to such damage there is an increased risk of the semiconductor wafer breaking at the damaged location. The damage is caused because a gas flow which flows between the handling tool and the semiconductor wafer with epitaxial layer presses the edge of the semiconductor wafer with epitaxial layer against a boundary of the handling tool. The damage caused can be identified for example by inspection using a confocal microscope or on an AFM (atomic force microscope) micrograph. WO 2010/015 694 A1 describes for example a suitable apparatus for inspecting the edge of a semiconductor wafer.

WO 99/27 577 A1 describes an apparatus for processing semiconductor wafers comprising a two-part susceptor unit having no lift pins for raising the semiconductor wafer with epitaxial layer, and comprising a substrate transfer system that dispenses with a handling tool operating according to the Bernoulli principle. There is a gap between an outer segment and an inner segment of the susceptor unit. In a similar manner to the abovementioned holes in the susceptor, the gap represents a structure in the susceptor which has a disturbing effect on the temperature field on the substrate wafer. Accordingly, the gap of the two-part susceptor unit brings about on the semiconductor wafer with epitaxial layer a trace, imaging the gap, which can be detected.

Various methods are available for detecting abovementioned traces on the front side and/or the rear side of a semiconductor wafer with epitaxial layer. By way of example, the detection method described in US 2012/0 177 282 A1 and US 2012/0 179 419 A1 is based on an evaluation of topography data obtained by interferometry, this evaluation being referred to as Localized Feature Metrics (LFM).

Local contour maps regarding the nanotopography of the front side and the rear side of a semiconductor wafer with epitaxial layer can thus be created. Maxima and minima (peaks and valleys) in the contour profile can be assigned to the abovementioned traces.

The abovementioned traces can also be detected for example with the aid of the evaluation of data based on laser light scattering. An apparatus that uses this measurement method is described for example in US 2010/0 195 097 A1.

Furthermore, detection by means of SIRD (Scanning Infra Red Depolarization) is also possible, a method that can be used to measure stresses in the semiconductor wafer with epitaxial layer. US 2004/0 021 097 A1 describes a method for detecting defects on semiconductor wafers by means of SIRD.

The stated object of the invention arose from the problems described.

SUMMARY OF THE INVENTION

An object of the invention is to provide a method for producing a semiconductor wafer with epitaxial layer in a deposition chamber, comprising placing a substrate wafer in the edge region of the rear side of the substrate wafer onto a placement area of a susceptor;

loading the deposition chamber with the susceptor and the substrate wafer lying on the susceptor by contacting the susceptor and transporting the susceptor and the substrate wafer lying on the susceptor from a load lock chamber into the deposition chamber;

depositing an epitaxial layer on the substrate wafer;

unloading the deposition chamber by contacting the susceptor and transporting the susceptor and a semiconductor wafer with epitaxial layer lying on the susceptor, from the deposition chamber into the load lock chamber.

The invention is furthermore directed to an apparatus for producing a semiconductor wafer with epitaxial layer, comprising a deposition chamber;

a load lock chamber;

a susceptor having a placement area for placing a substrate wafer in the edge region of the rear side of the substrate wafer;

lift elements for raising and lowering the susceptor and—lying on the susceptor—a substrate wafer or semiconductor wafer with epitaxial layer with contacting of the susceptor from below; and a transport tool, contacting the susceptor, for transporting the susceptor and a substrate wafer lying on the susceptor from the load lock chamber into the deposition chamber and for transporting the susceptor and a semiconductor wafer with epitaxial layer, said semiconductor wafer lying on the susceptor, from the deposition chamber into the load lock chamber.

The invention is also directed to a semiconductor wafer with epitaxial layer, having a front side, a rear side and an edge, wherein neither a pin-mark defect nor a defect representing the imaging of a gap is detectable on the front side and the rear side outside an edge exclusion of 1 mm, and no damage having a depth of more than 100 nm is present at the edge. Preferably, no damage having a depth of more than 50 nm is present at the edge of the semiconductor wafer with epitaxial layer.

DETAILED DESCRIPTION OF THE PREFERRED EMBODIMENTS

The front side and the rear side of the semiconductor wafer with epitaxial layer are thus free of traces demonstrating that the semiconductor wafer was arranged above holes with lift pins and/or above a gap in the susceptor during the deposition of the epitaxial layer, and the edge of the semiconductor wafer with epitaxial layer is free of pressure marks of a handling tool.

Different thermal expansion behavior of a substrate wafer and a susceptor may have the effect that a relative movement of substrate wafer and susceptor is initiated when the substrate wafer and the susceptor are heated to deposition temperature. However, this relative movement is slight and a possibly detectable trace of the relative movement on the rear side of the semiconductor wafer with epitaxial layer remains within the region of the edge exclusion of 1 mm, that is to say is at a distance of not more than 1 mm from the edge of the semiconductor wafer with epitaxial layer.

A pin-mark defect or a defect representing the imaging of a gap has a radial extent of not more than 15 mm and a height deviation with respect to its surroundings of at least ±5 nm.

The presence of such defects is detectable for example by LFM evaluation of measurement data of a metrology system of the WaferSight 2 type from KLA Tencor or is identifiable on a haze map of a Surfscan® SP3 inspection system from KLA Tencor or is visible on a nanotopography map of an inspection system of the AWX™ type from Rudolph Technologies or on an SIRD map of a system from PVA TePla.

Figure 7:
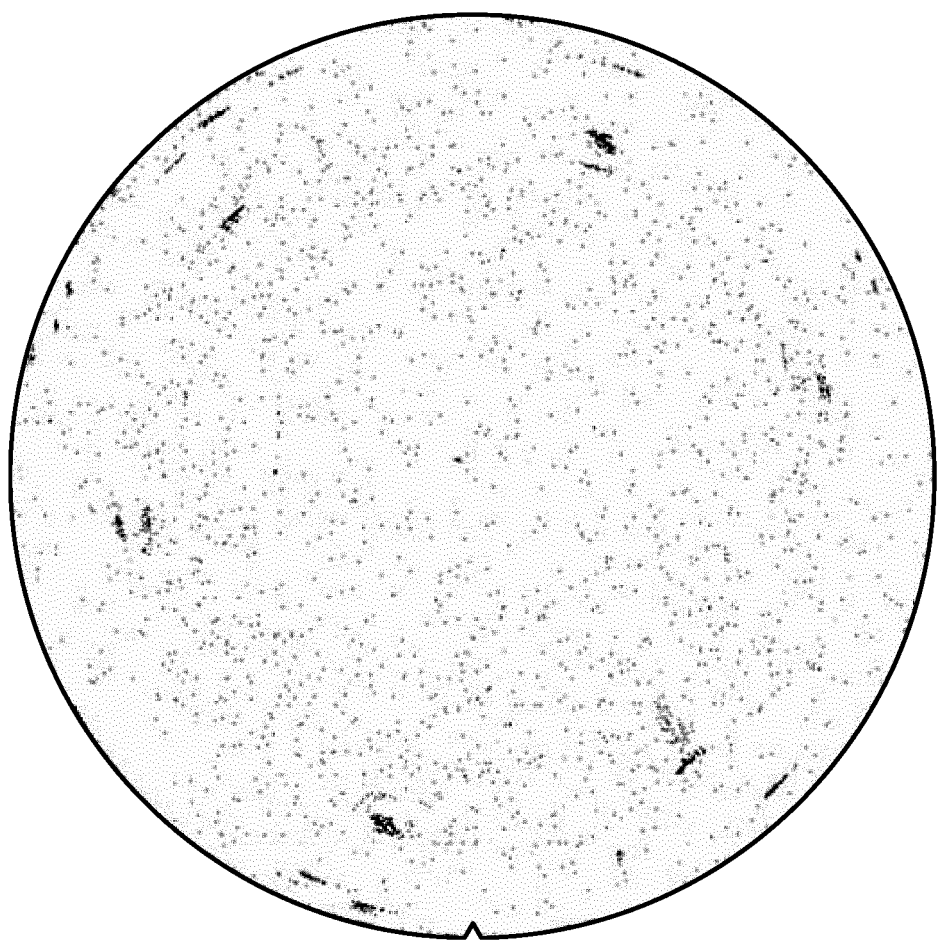
FIG. 7 shows pin-mark defects on the rear side of a semiconductor wafer with epitaxial layer.

FIG. 7 shows in a representative manner a stacked nanotopography map, on which sets of in each case three pin-mark defects can be seen, wherein the pin-mark defects of a set are at a radial distance of approximately 120° from the respective neighbor.

Figure 8:
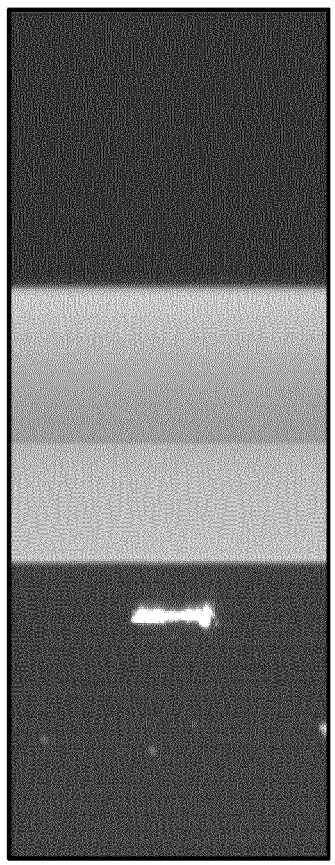
FIG. 8 shows damage at the edge of a semiconductor wafer with epitaxial layer, caused by a lift tool operating according to the Bernoulli principle.

The presence of damage at the edge of the semiconductor wafer with epitaxial layer which is caused by a handling tool operating according to the Bernoulli principle can be verified for example by inspection by means of AFM or with the aid of a confocal microscope. The micrograph in accordance with FIG. 8 shows such damage.

The semiconductor wafer with epitaxial layer according to the invention is preferably a semiconductor wafer composed of monocrystalline silicon with an epitaxial layer composed of monocrystalline silicon. It results from the deposition of an epitaxial layer on a substrate wafer composed of monocrystalline silicon having a preferably polished front side and polished rear side. The substrate wafer is preferably polished by simultaneous polishing of its front side and rear side, that is to say by double-side polishing (DSP). The diameter of the semiconductor wafer with epitaxial layer is preferably not less than 200 mm, particularly preferably not less than 300 mm.

The invention entails some advantages. In the deposition chamber there is no need to provide lift pins for raising the substrate wafer or the semiconductor wafer with epitaxial layer and holes necessary therefor in the susceptor need not be provided.

Considerable slipping of the substrate wafer from the envisaged concentric position with respect to the susceptor (out-of-pocket situation) is virtually precluded. A semiconductor wafer with epitaxial layer produced according to the method is distinguished by a particular high quality of the front side, the rear side and the edge.

These advantages result, in particular, from the fact that the substrate wafer and the susceptor or the semiconductor wafer with epitaxial layer and the susceptor are transported from the load lock chamber into the deposition chamber or from the deposition chamber into the load lock chamber as one unit by a transport tool. The transport tool holds the unit during the transport process only by the susceptor. The substrate wafer or the semiconductor wafer with epitaxial layer only has contact with the susceptor during the transport of the unit. The susceptor is embodied as a ring and has at the inner edge of the susceptor a placement area on which the substrate wafer or the semiconductor wafer with epitaxial layer bears in an edge region of its respective rear side. The ring preferably has a form described in US 2008/0 118 712 A1 and has the dimensions and material properties described therein. It is also preferred to place the ring in the deposition chamber onto a baseplate, such that the ring and the baseplate form a two-part susceptor. The baseplate preferably has the dimensions and material properties described in US 2008/0 118 712 A1.

The substrate wafer is arranged in a load lock chamber by a handling tool such that it can be placed on the ring. Once it has been placed on the ring, the substrate wafer lying on the ring is transported from the load lock chamber into the deposition chamber by a transport tool. During transport, the transport tool has contact with the ring, but has no contact with the substrate wafer. In the deposition chamber, the ring is placed onto lift pins and the lift pins, which have contact with the ring but have no contact with the substrate wafer, are lowered into a deposition position. In the deposition position, the ring preferably lies on a baseplate and with the latter forms a two-part susceptor.

After an epitaxial layer has been deposited on the substrate wafer, the resulting semiconductor wafer with epitaxial layer is raised together with the ring by the lift pins and transferred to the transport tool. Once again the lift pins touch only the ring, and not the semiconductor wafer with epitaxial layer lying on the ring, and once again the transport tool, during the transport of the ring and the semiconductor wafer with epitaxial layer lying on the ring from the deposition chamber into the load lock chamber, has contact with the ring but has no contact with the semiconductor wafer with epitaxial layer. During the process of unloading the deposition chamber, the temperature of the semiconductor wafer with epitaxial layer is preferably not less than 650° C., more preferably not less than 700° C.

On account of the procedure outlined, in the deposition chamber the temperature difference between the temperature of the substrate wafer or the semiconductor wafer with epitaxial layer and the temperature of the ring is not more than 50° C., preferably not more than 20° C.

The unit comprising ring and semiconductor wafer with epitaxial layer lying thereon is separated in the load lock chamber. At this point in time the semiconductor wafer with epitaxial layer is at a temperature which is significantly lower than the temperature thereof at the point in time directly after the deposition of the epitaxial layer. Accordingly, the contact with lift pins is less critical. Owing to the lower temperature, with regard to materials which are permitted to have contact with the semiconductor wafer with epitaxial layer, consideration may also be given to such materials which are stable only at comparatively low temperatures, such as plastics for example. Such materials generally also have a comparatively low degree of hardness. The use of such materials is preferred because thus the rear side of the semiconductor wafer with epitaxial layer can be touched and nevertheless reliably protected against mechanical damage.

In the load lock chamber the semiconductor wafer with epitaxial layer is raised from the ring by lift pins and, after the transport tool and the ring held by the latter have exited from the load lock chamber, the semiconductor wafer with epitaxial layer is preferably placed on a cooling block at the base of the load lock chamber by the lowering of the lift pins and is cooled further. It is also preferred at this point in time, in the load lock chamber, already to have a substrate wafer prepared for a new deposition cycle. In this regard, the transport tool with the ring can again enter the load lock chamber and the new deposition cycle can be begun by the prepared substrate wafer being placed on the ring for the subsequent joint transport of ring and substrate wafer lying on the ring into the deposition chamber.

During the deposition of an epitaxial layer on the prepared substrate wafer, the cooled semiconductor wafer with epitaxial layer is raised from the cooling block by lift pins, transferred to the handling tool and conveyed from the load lock chamber into a transport container in order to make space for the semiconductor wafer with epitaxial layer arising in the new deposition cycle.

The features specified with regard to the abovementioned embodiments of the method according to the invention can correspondingly be applied to the apparatus according to the invention. Conversely, the features specified with regard to the abovementioned embodiments of the apparatus according to the invention can correspondingly be applied to the method according to the invention. These and other features of the embodiments according to the invention are explained in the description of the figures and in the claims. The individual features can be realized either separately or in combination as embodiments of the invention. Furthermore, they can describe advantageous embodiments which are independently protectable.

Particularly preferred features of the invention are described below with reference to drawings.

LIST OF REFERENCE SIGNS USED 1 semiconductor wafer with epitaxial layer
2 deposition chamber
3 load lock chamber
4 substrate wafer
5 ring
7 transport tool
8 end effector
9 access slots
10 robot
11 handling tool
12 upper holding clamps
13 lower holding clamps
14 cooling block 15 inner lift pins
16 outer lift elements
17 head
18 elevation
19 supporting device
20 baseplate
21 lift pins
22 deep region of the head
23 placement area

DETAILED DESCRIPTION OF EXEMPLARY EMBODIMENTS ACCORDING TO THE INVENTION

Figure 1:
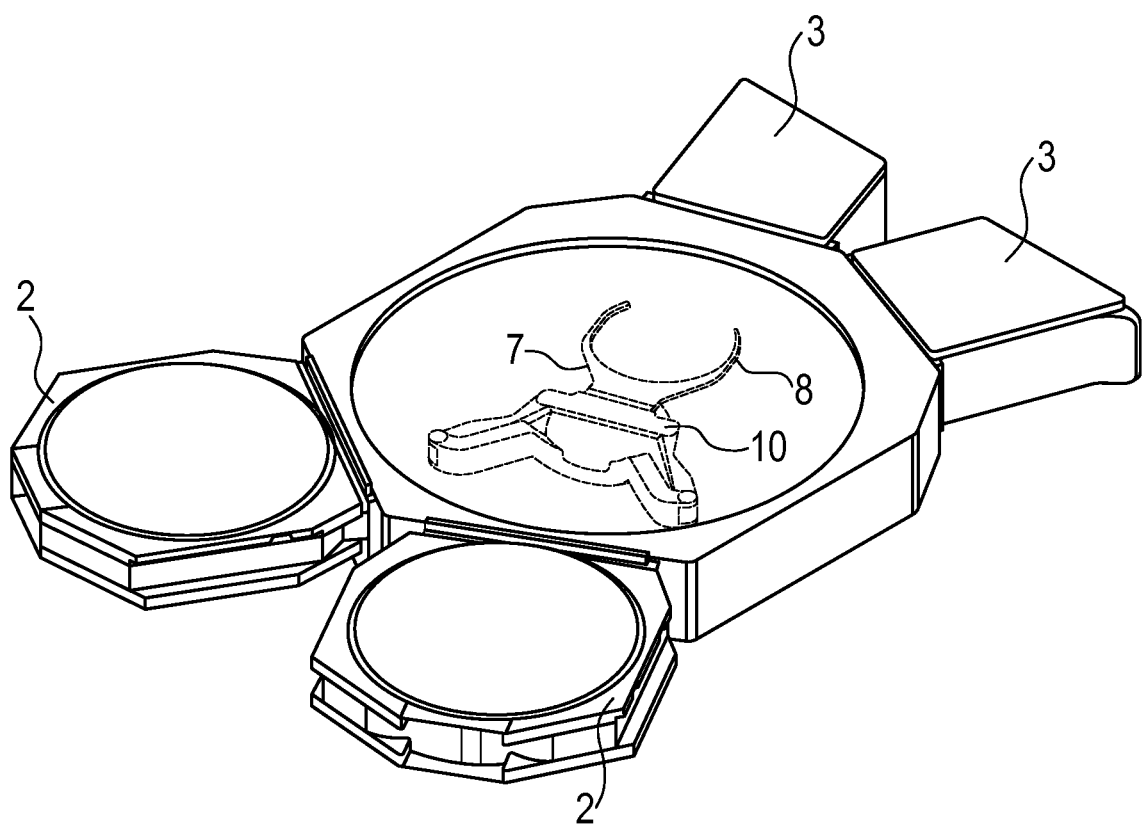
FIG. 1 shows an apparatus according to the invention for producing a semiconductor wafer with epitaxial layer.

FIG. 1 shows an apparatus according to the invention for producing a semiconductor wafer with epitaxial layer. The illustration shows an exemplary embodiment comprising two load lock chambers 3 and two deposition chambers 2, which are grouped around a transport tool 7. The transport tool 7 is essentially an end effector 8 fixed to a robot 10. The end effector 8 has fingers for carrying a susceptor. The robot 10 is configured such that the end effector 8 can be introduced into a load lock chamber 3 and raised and lowered there.

Figure 2:
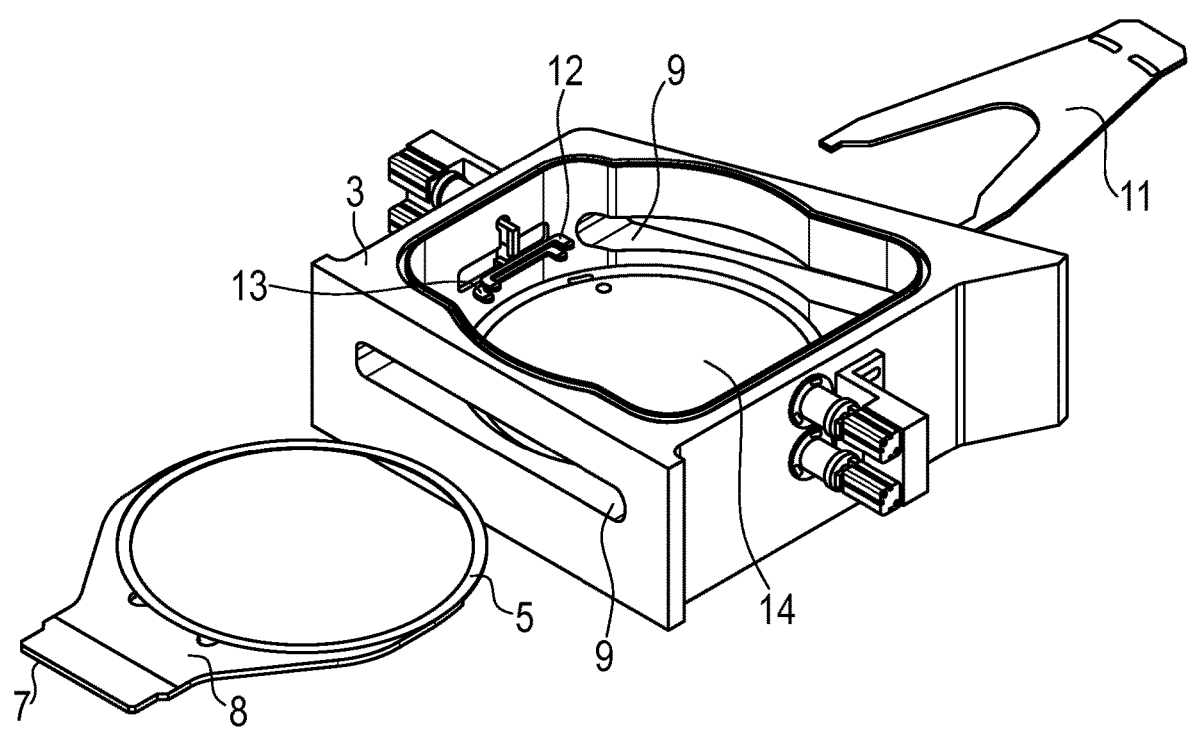
FIG. 2 shows a load lock chamber having features according to the invention.

The load lock chamber 3 in accordance with FIG. 2 has access slots 9 for the transport tool 7 and a handling tool 11, which are situated opposite one another, and as a special feature, horizontally movable, upper and lower holding clamps 12, 13. The upper and lower holding clamps 12, 13 respectively form a pair of holding clamps arranged opposite one another. Each pair of holding clamps can be moved from a release position into a holding position. In the release position, the holding clamps of a pair are in an inactive state and drawn away from one another outward. In the holding position, they are in an active state. They are moved toward one another and are at a distance from one another which enables them to be able to receive and hold in a centering manner a wafer placed from above. The upper holding clamps 12 are provided for receiving and for holding a substrate wafer, and the lower holding clamps 13 are provided for receiving and for holding a semiconductor wafer with epitaxial layer. FIG. 2 also shows the end effector 8 of the transport tool 7 with susceptor placed thereon, which is embodied as a ring 5, and a handling tool 11 having the form of a scoop on which a wafer can be placed in a centered manner. A cooling block 14 having a preferably cylindrical shape forms the base of the load lock chamber.

Figure 3:
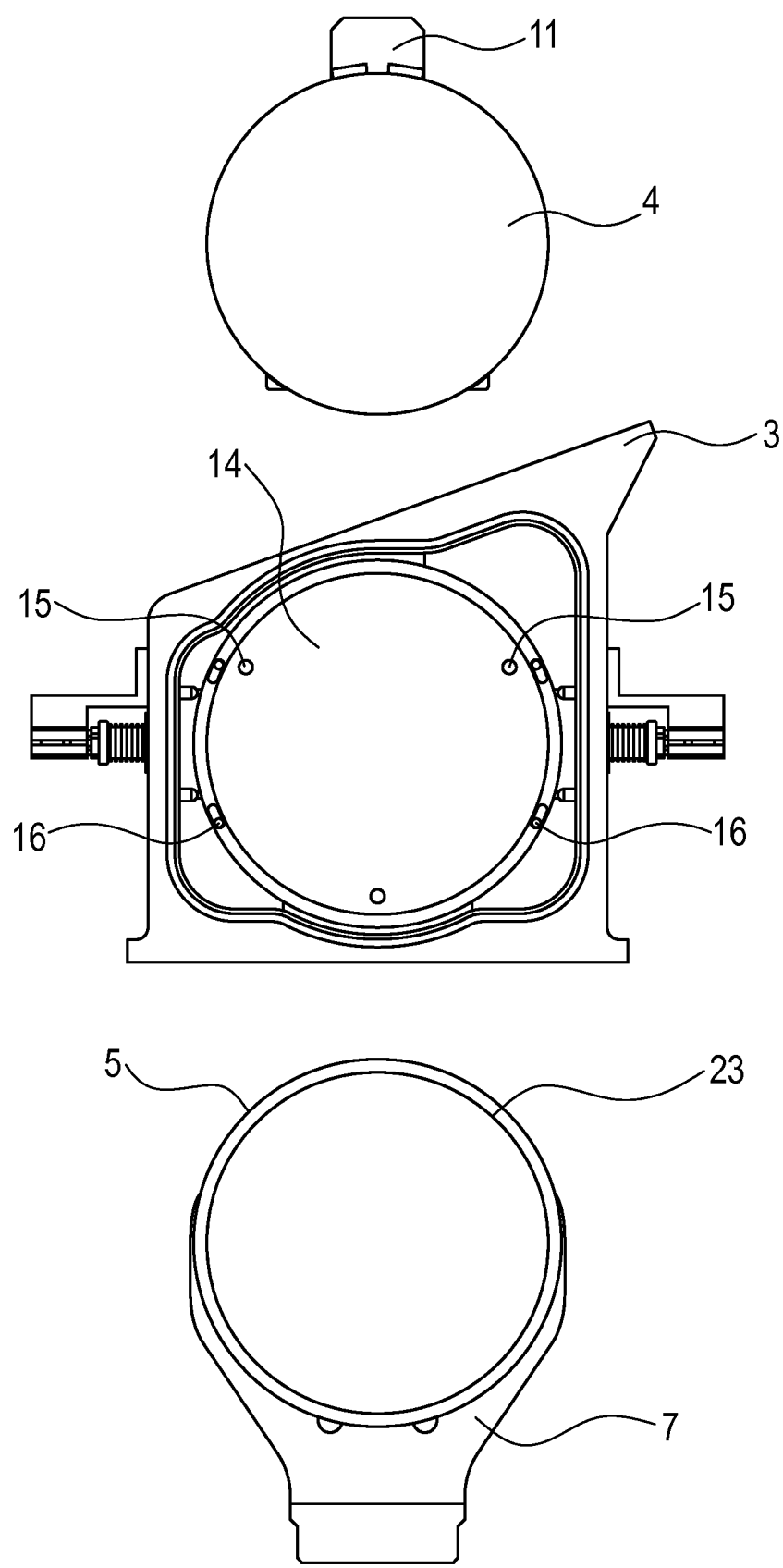
FIG. 3 shows the load lock chamber in plan view.

The cooling block 14 can be seen in plan view in FIG. 3. Provision is made for placing a semiconductor wafer with epitaxial layer on the upper side of the cooling block 14 for the purpose of cooling. The cooling block 14 has holes for receiving outer lift elements 16 and inner lift pins 15. The holes for the inner lift pins 15 are at a smaller distance from the center of the cooling block 14 than the holes for the outer lift elements 16. They are arranged far enough from the edge of the cooling block 14 to preclude contact with the ring 5, the handling tool 11 or the transport tool 7 when the inner lift pins 15 are raised. With regard to their radial position, the holes for the inner lift pins 15 are preferably arranged in a manner offset with respect to the holes for the outer lift elements 16, that is to say that the holes lie on different radii. Preferably, at least three outer lift elements 16 and at least three inner lift pins 15 are present. Furthermore, FIG. 3 shows the handling tool 11 with substrate wafer 4 placed thereon and the transport tool 7 with ring 5 placed thereon, said ring having a placement area 23 for placing a substrate wafer 4.

The deposition chamber comprises features of a customary single-wafer reactor for vapor deposition, preferably a single-wafer reactor of the EPI CENTURA® type from the manufacturer Applied Materials or a single-wafer reactor from the manufacturer Advanced Semiconductor Materials. Accordingly, FIG. 4 only shows features which contribute to an understanding of the invention and/or those which are features of the present invention. The deposition chamber 2 comprises a supporting device 19 for supporting a susceptor. In accordance with the preferred embodiment illustrated, the supporting device 19 is designed for supporting a two-part susceptor consisting of a ring 5 and a baseplate 20. The ring 5 can be placed on the baseplate 20 and, in the placed state, is preferably embedded in the baseplate 20. The supporting device 19 comprises vertically movable lift pins 21 configured in such a way that they contact the ring 5 from below during the raising process. However, the deposition chamber 2 lacks vertically movable lift pins which contact and raise the substrate wafer 4 or the semiconductor wafer with epitaxial layer.

The sequence of the method for producing a semiconductor wafer with epitaxial layer is described below.

Figure 5:
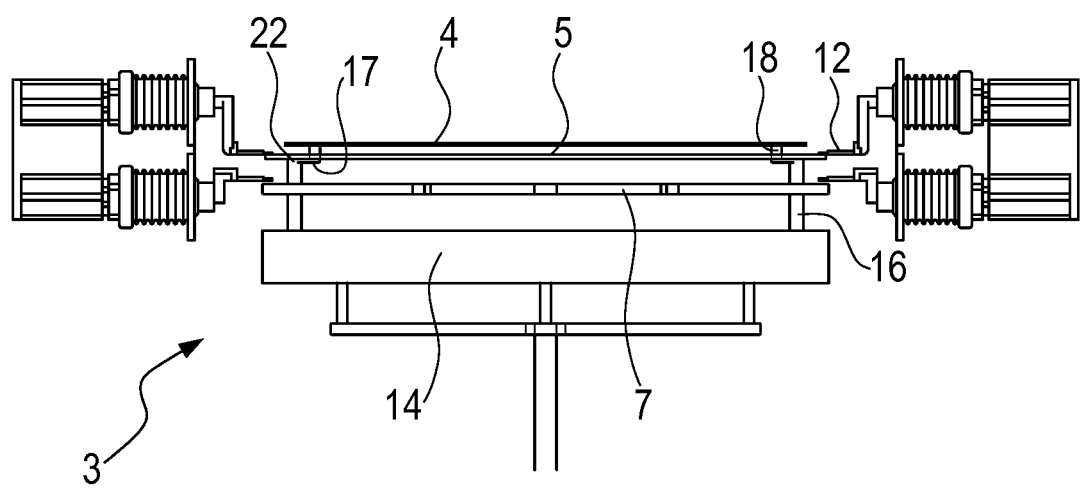
FIG. 5 shows the load lock chamber in cross section in a situation with a substrate wafer.

Firstly, the load lock chamber 3 is loaded with a substrate wafer 4 and a ring 5 embodied as a susceptor, wherein the arrangement shown in cross section in FIG. 5 arises in the course of loading. First the upper holding clamps 12 of the load lock chamber 3 are brought to the holding position and subsequently or simultaneously a substrate wafer 4 lying on the handling tool 11 is moved into a placement position above the upper holding clamps 12 by virtue of the handling tool 11 with the substrate wafer 4 entering through the access slot 9 into the load lock chamber 3 as far as the placement position. The substrate wafer 4 is thereupon placed on the upper holding clamps 12 by virtue of the handling tool 11 being lowered below the level of the upper holding clamps 12. Once the substrate wafer 4 lies on the upper holding clamps 12, the handling tool 11 is withdrawn from the load lock chamber 3 through the access slot 9. The outer lift elements 16 are rotatable and each have a head 17, which is angled to form a hook and which can change between a tangential and a radial position by the pivoting of the outer lift element 16. The end of the angled head 17 is lengthened upward by a pinlike elevation 18. In the radial position of the head 17, the elevation 18 is situated further inward than the deep region 22 of the head 17, which adjoins the elevation 18. The elevation 18 is used for raising and lowering a substrate wafer 4, and the adjoining deep region 22 of the head 17 is used for raising and lowering a ring 5 used as a susceptor.

The transport tool 7, on which a ring 5 lies, moves through the access slot 9 into the load lock chamber 3 into a position in which the ring 5 lies concentrically below the substrate wafer 4. Then the outer lift elements 16 are raised and each head 17 of the outer lift elements 16 is pivoted from the tangential position into the radial position. The outer lift elements 16 are then raised further until the substrate wafer 4 has been lifted from the upper holding clamps 12 and, somewhat later, the ring 5 has been lifted from the transport tool 7, wherein the heads 17 of the outer lift elements 16 raise the ring 5 with the respective deep region 22 of a head 17 and the substrate wafer 4 with the respective elevation 18 of a head 17. The upper holding clamps 12 are thereupon withdrawn into the release position. FIG. 5 shows the arrangement then attained in cross section.

Afterward, the outer lift elements 16 are lowered and, in the course thereof, the ring 5 is placed back onto the transport tool 7 and the substrate wafer 4 is placed by the edge region of its rear side on the placement area 23 of the ring 5. Afterward, the heads 17 of the outer lift elements 16 are pivoted back into the tangential position and the outer lift elements 16 are lowered into a rest position in which the heads 17 are admitted in the cooling block 14. The transport tool 7 together with the ring 5 and the substrate wafer 4 lying on the ring 5 is conveyed through the access slot 9 of the load lock chamber 3 from the load lock chamber 3 into the deposition chamber 2. The transport tool 7 has no direct contact with the substrate wafer 4.

Figure 4:
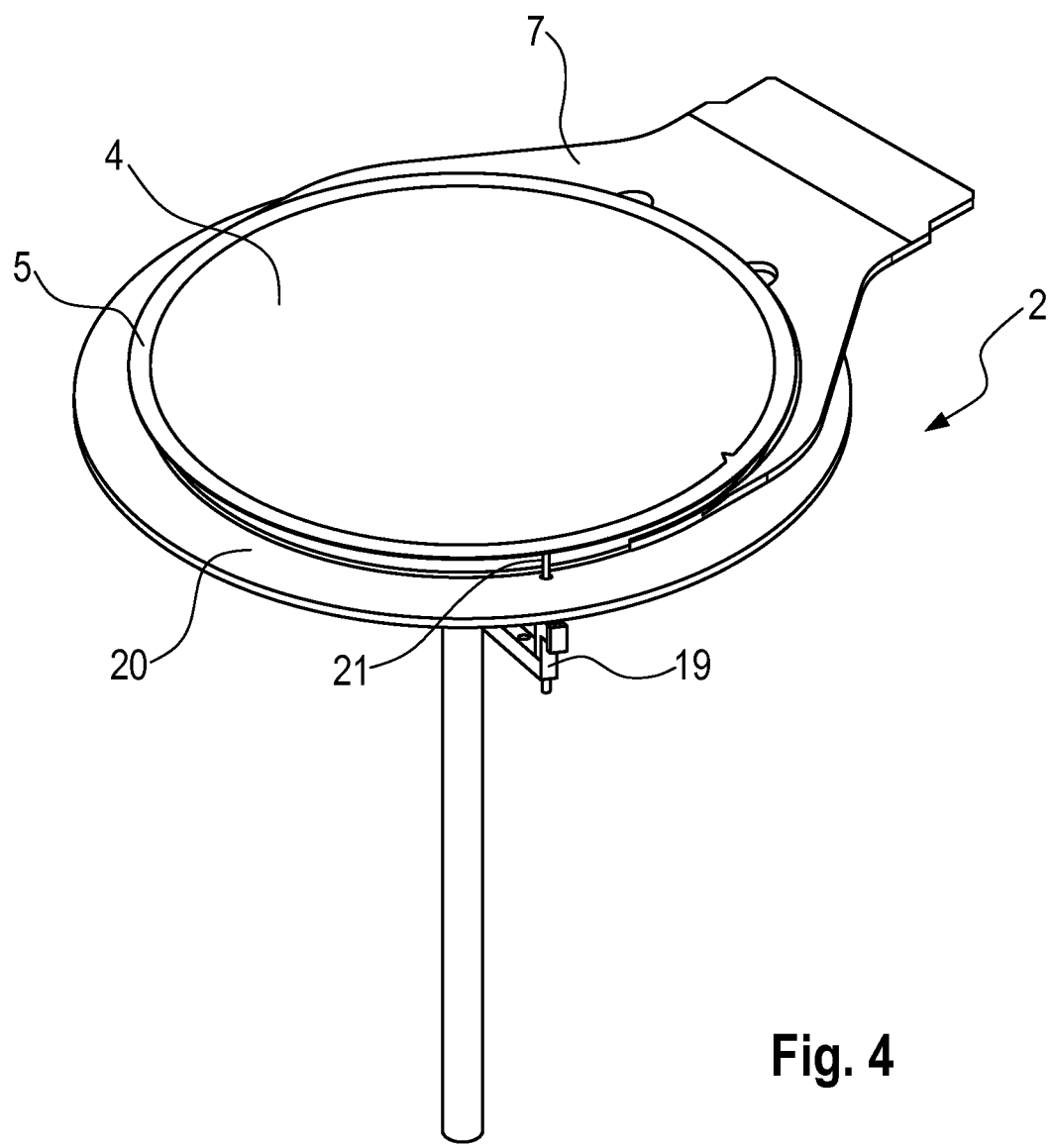
FIG. 4 shows features of the deposition chamber which are related to the invention.

In the deposition chamber 2 the ring 5 is brought to a position from which it can be raised by lift pins 21. In the exemplary embodiment illustrated in FIG. 4, the ring 5 is held by the transport tool 7 above a baseplate 20, which together with the ring 5 forms a two-part susceptor. The ring 5 is arranged concentrically with respect to the baseplate 20. The lift pins 21 leading through the baseplate 20 are raised vertically from a rest position until they have lifted the ring 5 and the substrate wafer 4 lying thereon from the transport tool 7. The lift pins 21 contact the ring 5 from below and are embodied such that they cannot make contact with the substrate wafer 4. FIG. 4 shows the arrangement in perspective view.

Next the transport tool 7 is drawn out of the deposition chamber 2 and the lift pins 21 are lowered until the ring 5 lies on the baseplate 20. Afterward, an epitaxial layer is deposited on the front side of the substrate wafer 4. The lift pins 21 are then raised again. They contact the lower side of the ring 5 and lift the ring 5 and the semiconductor wafer with epitaxial layer lying thereon from the baseplate 20. The movement of the ring 5 with placed semiconductor wafer with epitaxial layer takes place in a mirror-reversed fashion relative to the previous movement of the ring 5 with placed substrate wafer 4.

The ring 5 is raised and the transport tool 7 is brought back into the deposition chamber 2 and arranged below the ring 5 in a concentric position with respect to the ring 5. The lift pins 21 are moved back into their rest position and in the process place the ring 5 and the semiconductor wafer with epitaxial layer lying on the ring 5 on the transport tool 7. The time during the deposition of the epitaxial layer on the substrate wafer is used to load the load lock chamber 3 with a further substrate wafer 4 to be coated.

Figure 6:
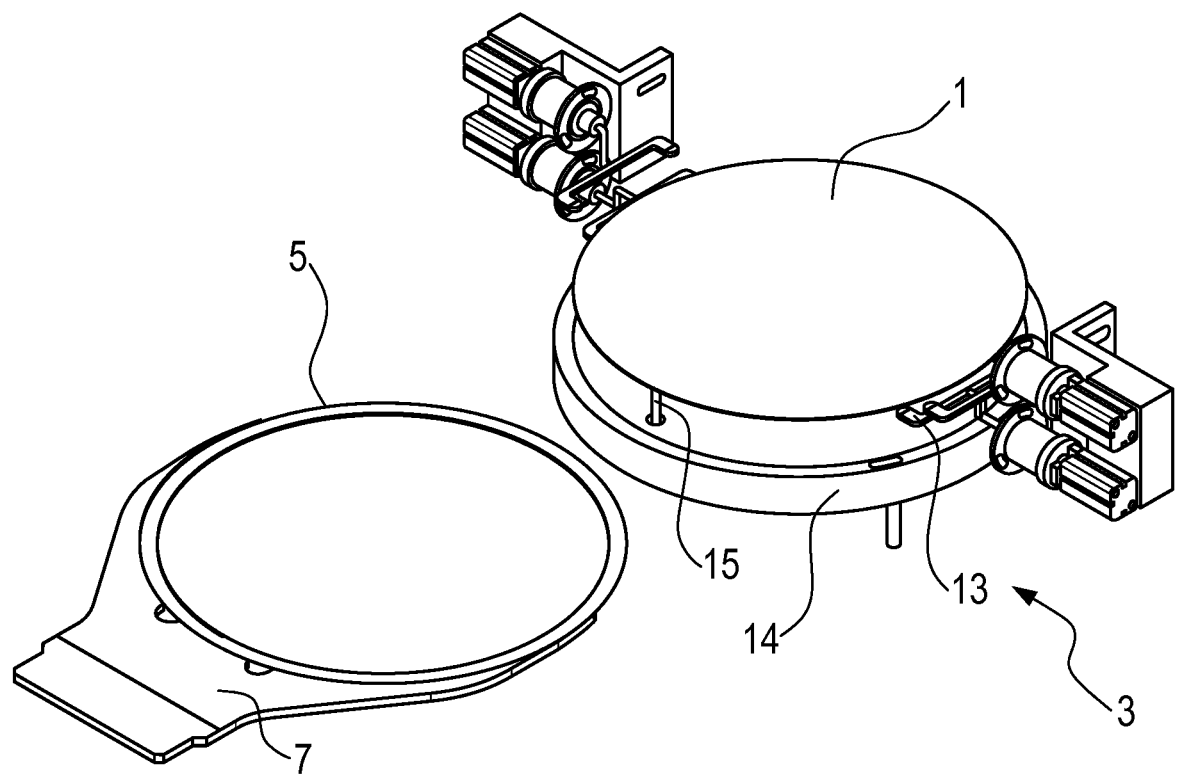
FIG. 6 shows the load lock chamber in perspective view in a situation with a semiconductor wafer with epitaxial layer.

The transport tool 7 conveys the ring 5 with the semiconductor wafer with epitaxial layer 1 lying thereon into the load lock chamber 3, specifically into a vertical position below the lower holding clamps 13 and concentrically with respect to the prepared substrate wafer 4 to be coated. The inner lift pins 15 are then raised until they contact the semiconductor wafer with epitaxial layer 1 on the rear side thereof and lift it off the ring 5. Afterward, the lower holding clamps 13 are shifted from the release position to the holding position, and the inner lift pins 15 are moved back to their initial position. In the course of this, the semiconductor wafer with epitaxial layer 1 is placed on the lower holding clamps 13. Next the transport tool 7 together with the ring 5 placed thereon is moved out of the load lock chamber 3. The inner lift pins 15 are then raised again until they lift the semiconductor wafer with epitaxial layer 1 from the lower holding clamps 13. FIG. 6 shows the resulting arrangement in perspective view, wherein the prepared substrate wafer to be coated has been omitted for reasons of simplification. Afterward, the lower holding clamps 13 are returned to the release position and the inner lift pins 15 are lowered back again to their initial position, as a result of which the semiconductor wafer with epitaxial layer 1 is placed on the cooling block 14.

The inner lift pins 15 are also used, after the cooling, to lift the semiconductor wafer with epitaxial layer 1 from the cooling block 14 and to transfer it to the handling tool 11 in order thus subsequently to convey it into a transport container.

The above description of exemplary embodiments should be understood to be by way of example. The disclosure thus effected firstly enables the person skilled in the art to understand the present invention and the advantages associated therewith, and secondly, within the understanding of the person skilled in the art, also encompasses obvious alterations and modifications of the structures and methods described. Therefore, all such alterations and modifications and equivalents are intended to be covered by the scope of protection of the claims.

The invention claimed is:

1. A method for producing a semiconductor wafer with an epitaxial layer in a deposition chamber, comprising
   placing an edge region of the rear side of a substrate wafer onto a placement area of a susceptor in a load lock chamber;
   loading the deposition chamber with the susceptor and the substrate wafer lying on the susceptor by contacting the susceptor and transporting the susceptor and the substrate wafer lying on the susceptor from the load lock chamber into the deposition chamber;
   depositing the epitaxial layer on the substrate wafer to form a coated semiconductor wafer with the epitaxial layer, while loading the load lock chamber with a further substrate wafer to be coated;
   unloading the deposition chamber by contacting the susceptor and transporting the susceptor and the semiconductor wafer with the epitaxial layer lying on the susceptor during the transport from the deposition chamber into the load lock chamber; and
   separating the susceptor from the semiconductor wafer with the epitaxial layer in the load lock chamber.

2. The method of claim 1, further comprising unloading the deposition chamber at a point in time at which the temperature of the semiconductor wafer with the epitaxial layer is not less than 650° C.

3. An apparatus for producing an epitaxially coated semiconductor wafer, comprising:
   a deposition chamber;
   a load lock chamber;
   a susceptor having a placement area for placing a substrate semiconductor wafer in an edge region of the rear side of the substrate semiconductor wafer;
   in the load lock chamber, lift elements for raising and lowering the susceptor and the substrate semiconductor wafer or the epitaxially coated semiconductor wafer lying on the susceptor, by contacting the susceptor from below, upper holding clamps for placing the substrate semiconductor wafer or the epitaxially coated semiconductor wafer, and lift pins for lifting the substrate semiconductor wafer or epitaxially coated semiconductor wafer from the susceptor, and
   a transport tool, adapted to contact the susceptor, for transporting the susceptor and the substrate semiconductor wafer lying on the susceptor from the load lock chamber into the deposition chamber and for transporting the susceptor and the epitaxially coated semiconductor wafer lying on the susceptor from the deposition chamber into the load lock chamber.

4. The apparatus of claim 3, having an at least two-part susceptor comprising a ring which contains the placement area, and a baseplate which is located in the deposition chamber.

\* \* \* \* \*